United States Patent
Wan

(10) Patent No.: US 8,831,243 B2
(45) Date of Patent: Sep. 9, 2014

(54) METHOD OF AND CIRCUIT FOR ADJUSTING FREQUENCY OF A DRIVING SIGNAL OF ELECTRONIC HORN BY MEANS OF CAPACITOR

(76) Inventor: Yu Wan, Haerbin (CN)

( * ) Notice: Subject to any disclaimer, the term of this patent is extended or adjusted under 35 U.S.C. 154(b) by 1311 days.

(21) Appl. No.: 12/278,716

(22) PCT Filed: Feb. 13, 2006

(86) PCT No.: PCT/CN2006/000217
§ 371 (c)(1),
(2), (4) Date: Aug. 7, 2008

(87) PCT Pub. No.: WO2007/093076
PCT Pub. Date: Aug. 23, 2007

(65) Prior Publication Data
US 2010/0166217 A1 Jul. 1, 2010

(51) Int. Cl.
    H03G 5/00 (2006.01)
    H03J 3/20 (2006.01)
    H03F 3/217 (2006.01)
    B06B 1/02 (2006.01)
    H03K 17/687 (2006.01)

(52) U.S. Cl.
    CPC .............. H03J 3/20 (2013.01); H03F 3/2171 (2013.01); H03F 2200/351 (2013.01); H03F 2200/03 (2013.01); B06B 1/0253 (2013.01); H03K 17/687 (2013.01)
    USPC ................ 381/98; 381/99; 381/111; 381/116

(58) Field of Classification Search
    CPC ........................................................ H03J 3/20
    USPC ...................... 381/98, 99, 111, 116, 117, 120
    See application file for complete search history.

(56) References Cited

U.S. PATENT DOCUMENTS

| | | | | |
|---|---|---|---|---|
| 4,287,510 | A | * | 9/1981 | Siegwarth ................ 340/384.72 |
| 4,384,361 | A | * | 5/1983 | Masaki ........................ 340/7.38 |
| 4,973,876 | A | * | 11/1990 | Roberts .................... 310/316.01 |
| 5,266,921 | A |  | 11/1993 | Wilson |
| 5,942,815 | A | * | 8/1999 | Neuman et al. ................ 307/139 |
| 2004/0085142 | A1 | * | 5/2004 | Senthilkumar et al. ...... 331/36 C |
| 2007/0024379 | A1 | * | 2/2007 | Greenberg et al. ............. 331/16 |

FOREIGN PATENT DOCUMENTS

| CN | 2204062 Y | 7/1995 |
|---|---|---|
| CN | 1152159 A | 6/1997 |

OTHER PUBLICATIONS

International Search Report.
International Search Report (PCT/ISA/210).

* cited by examiner

*Primary Examiner* — Kimberly Rizkallah
*Assistant Examiner* — Maria Ligai
(74) *Attorney, Agent, or Firm* — Buchanan Ingersoll & Rooney PC

(57) ABSTRACT

The present invention discloses a driving circuit for electronic horn and a driving method for the electronic horn. The driving circuit includes an oscillating circuit, which generates a signal having oscillating frequency. Based on the signal, said driving circuit generates a driving signal to drive the electronic horn to produce sound. It is characterized in that said oscillating circuit includes a variable capacitor, and the oscillating frequency is changed by adjusting capacitance of the variable capacitor so as for the frequency of the driving signal to be consistent with working frequency of the electronic horn. The present invention overcomes the problem of mismatch between the frequency of circuit's driving signal and the horn's sounding diaphragm and horn's tone inflexion due to resistance change caused by vehicle vibration.

21 Claims, 3 Drawing Sheets

METHOD OF AND CIRCUIT FOR ADJUSTING FREQUENCY OF A DRIVING SIGNAL OF ELECTRONIC HORN BY MEANS OF CAPACITOR

TECHNICAL FIELD

This invention relates to electronic horn for vehicle, and more particularly, to a method of and circuit for adjusting frequency of driving signal of the electronic horn.

BACKGROUND OF THE INVENTION

With development of vehicle techniques, a lot of mechanical vehicle parts have been replaced with electronic parts, and the vehicle horn has been through several modifications, a major change of which is that an electronic oscillator has been used to replace mechanical contacts so as to extend lifespan of the horn and decrease interference introduced by the electromagnetic radiation. Up to hundreds of patents have been invented in this regard. But, most of them have not been put into practice since they fail to achieve a driving circuit, frequency of which is consistent with resonant frequency of the horn's acoustic system including horn diaphragm and resonance cavity.

Because the sounding diaphragm of the horn has inherent resonant frequency just as a tuning fork, a key point to the electronic horn is that signal frequency produced by the horn's electronic circuit should be consistent with that of the sounding diaphragm and the acoustic system, so as for the horn to produce optimum sound and achieve higher horn efficiency and better stability.

Currently, ways of adjusting frequency for electronic horn can be classified into three categories:
1. adjusting resistance to change oscillating frequency;
2. changing oscillating frequency by means of frequency synthesis;
3. using microcomputer chips to directly generate a signal having a particular frequency.

Among these, the second and the third categories of ways can produce a signal frequency, which is in good match with that of horn diaphragm, but they result in higher cost. The first category of ways can produce a signal having the same frequency as the diaphragm, but the frequency might change under operation due to the resistance change since the adjustable resistor comprises a contact which, under vehicle vibration, may inevitably lead to a resistance change.

Taking the first category of way for example, there is an alternative solution, in which an adjustable resistor may be used to find the match point and then replaced with a fixed resistor. By this way, no resistance change of the fixed resistor would be found when the vehicle is vibrating. However, the adjustable resistor could hardly be replaced by fixed resistors with the same resistance. For example, the adjustable resistor is tested to have a resistance value of 4.85 kΩ when the driving circuit is in a good match with the horn diaphragm. But, fixed resistors have generally discrete values such as 4.7 KΩ, or 5.1 kΩ, no fixed resistor being found to have exactly the value of 4.85 kΩ. The adjustable resistor with the tested resistance has to be replaced with a fixed resistor having approximate but different value, which might lead to a dramatic change in frequency and thus a drop of horn performance. Even if a fixed resistor having exactly the same resistance as the adjustable resistor has been found, the horn assembled with the fixed resistor may suffer a great change in performance from the test due to distributed capacitors along leads in the adjustable resistor.

Therefore, the problem in respect of stability and reliability has not been solved for long time. The U.S. Pat. No. 5,266,921, titled as 'Method and apparatus for adjusting vehicle horns' and granted in Nov. 30, 1993 uses laser to trim resistor to avoid the problem of resistance change. But, this method has its own defect, i.e., the frequency can not be adjusted to the match point. Because a point can only be learned to be the match point only after it is passed. If the match point is passed, it means over-tuned, otherwise it is mis-tuned.

Therefore, the adjusting methods mentioned above have bad industrial applicability and can not be well practiced in mass production.

SUMMARY OF THE INVENTION

Therefore, it is an object of the present invention to provide a method of and circuit for adjusting frequency of a driving signal for driving an electronic horn.

According to a first aspect, the present invention provides a driving circuit for electronic horn including an oscillating circuit, said oscillating circuit generates a signal having an oscillating frequency and, based on the signal, said driving circuit generating a driving signal to drive the electronic horn to produce sound, characterized in that said oscillating circuit includes a variable capacitor, the oscillating frequency may be changed by adjusting capacitance of the variable capacitor so as for the frequency of the driving signal to be consistent with working frequency of the electronic horn.

According to a second aspect, the present invention provides a method of driving an electronic horn, said method comprising: generating, by an oscillating circuit having a variable capacitor, a signal having an oscillating frequency; generating, based on the signal, a driving signal to drive the electronic horn to produce sound, characterized in that said method comprises changing the oscillating frequency by adjusting capacitance of the variable capacitor so as for the frequency of the driving signal to be consistent with working frequency of the electronic horn.

In the invention, the oscillating circuit is preferably implemented by a RC oscillator within a monolithic processor.

Preferably, said oscillating circuit includes a second capacitor in parallel with the variable capacitor. More preferably, capacitance ratio of the variable capacitor and the second capacitor is approximately 1:10-15.

Preferably, the oscillating frequency is approximately between 20400-33400 Hz.

Preferably, said oscillator is a multi-vibrator composed of inverters. Alternatively, said oscillator is formed by gate circuits, schmitt circuit, operation amplifier or discrete elements.

The present invention uses a variable capacitor to adjust frequency of the driving signal, and achieves the advantages: (1) continuously adjustable frequency; (2) no frequency drifting in a long term; (3) lower cost; (4) suitable for mass production.

The above and other objects, features, and advantages of the present invention will become apparent from the following detailed description thereof, which is described with reference to the accompanying drawings in which the like reference numerals represent the same or similar elements.

BRIEF INTRODUCTION OF THE DRAWING

DETAILED DESCRIPTION OF THE PREFERRED EMBODIMENT

Figure 1:
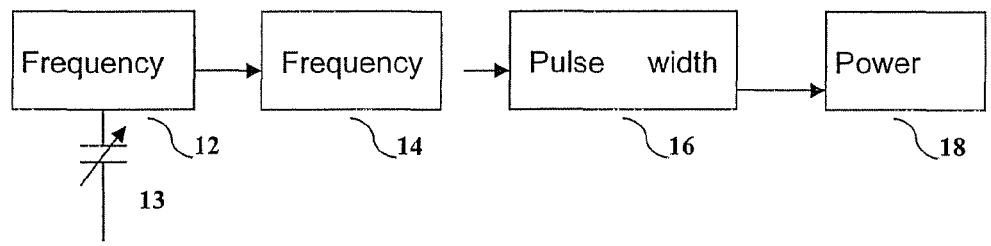
FIG. 1 illustrates a block diagram of a driving circuit for electronic horn according to the present invention.

FIG. 1 illustrates a block diagram of a driving circuit for electronic horn according to the present invention. As shown in FIG. 1, the driving circuit includes frequency oscillator 12, frequency divider 14, pulse width adjusting unit 16 and power driving unit 18.

Frequency oscillator 12 includes a variable capacitor 13. Frequency oscillator 12 generates a signal having an oscillating frequency. The oscillating frequency may be changed by varying capacitance of the variable capacitor 13.

In a preferable embodiment, frequency oscillator 12 oscillates in high frequency. Generally speaking, the frequency for an individual horn needs to be adjusted within ±5% of a prescribed fundamental frequency. Oscillating at higher frequency may help reduce the capacitance of the variable capacitor 13, thus reduce the circuit volume and enhance stability of the circuit. In addition, to improve stability of the circuit and diminish environmental effects, the oscillating frequency is preferred not too high. Generally, the oscillating frequency is about 20-35 kHz, depending on individual horn sounding frequency requirements. If the oscillating frequency is higher, additional stage of the frequency divider has to be added, which may adversely affect the adjusting precision; if the oscillating frequency is lower, given same adjusting range, capacitance of the variable capacitor has to be increased, which means a larger volume of the variable capacitor, adversely affecting the horn assembly.

In another preferable embodiment, a parallel connection between a fixed capacitor and the variable capacitor is adopted in order to ensure stability of the circuit and effective adjustment range and decrease adverse influence to frequency stability caused by capacitance change of the variable capacitor due to temperature change. It is preferable for the capacitance ratio of the variable capacitor and the fixed capacitor to be about 1:10-15.

Frequency divider 14 receives the output signal of frequency oscillator 12 and conducts frequency division to the signal so as for the divided frequency consistent with horn's working frequency and then outputs the frequency-divided signal to pulse width adjusting unit 16.

The pulse width adjusting unit 16 conducts pulse width adjustment to the frequency-corrected signal. In order for the sound produced by the horn to meet prescribed frequency spectrum, pulse width adjustment unit needs to adjust the signal's pulse width, thereby to change their harmonic components.

In addition, in condition that the horn sounding spectrum requirement is met, electro-acoustic conversion efficiency of the horn will be enhanced. Lower horn driving power will effectively have the result of energy-saving. Driven by a signal having duty cycle ratio of 5:3, more energy could be saved and better sound quality achieved.

Power driving unit 18 conducts power amplification to the pulse-width-adjusted signal so as to drive the horn's electromagnetic windings. The power driving unit may be realized by devices such as transistors.

Figure 2:
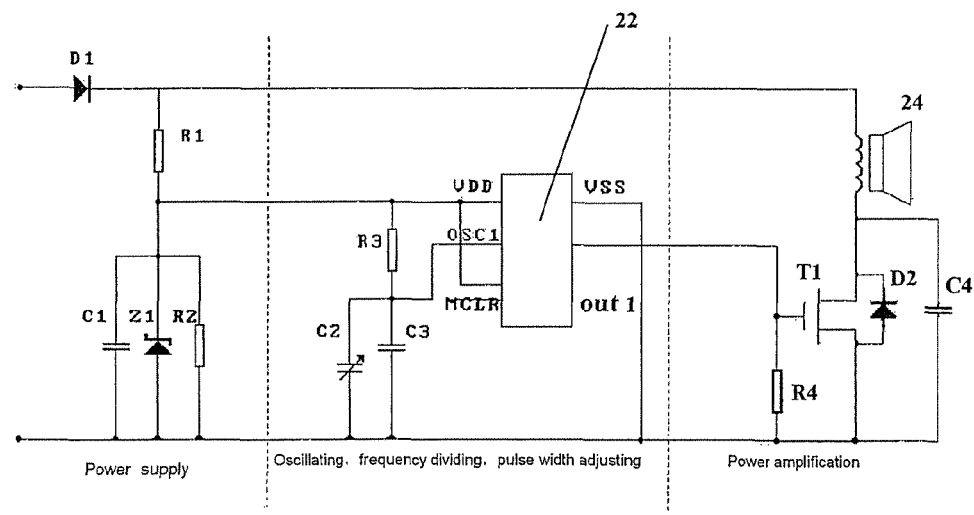
FIG. 2 illustrates the driving circuit according to a first embodiment of present invention.

FIG. 2 illustrates a driving circuit according to a first embodiment of present invention. This driving circuit utilizes a variable capacitor to adjust the circuit's oscillating frequency, and conducts frequency division and pulse width adjustment by means of monolithic processor, and uses transistor(s) to conduct power amplification so as to drive the horn.

The driving circuit includes a power supply part, a oscillating, frequency-dividing and pulse width adjusting part, and a power amplifying part. The power supply part is a series-connected regulation circuit, which consists of a diode D1 protecting from reverse connection, a current limiting resistor R1 and a regulating diode Z1. The diode D1 has its anode connected with the positive power terminal, and its cathode side connected with resistor R1. A capacitor C1 and a resistor R2 are in parallel connection with the diode Z1, and then connected between the negative power terminal and resistor R1 to provide stable voltage. The voltage of the power supply is for example between 9-48 volt, and the stable voltage thus generated is for example about 5 volt. Those skilled in the art will realize that the power supply part may be realized by other kinds of regulator.

The oscillating, frequency dividing and pulse width adjusting part is formed by a monolithic processor 22. Those skilled in the art may realize that the monolithic processor 22 could be any monolithic processor having RC oscillating function. The monolithic processor 22 has a VDD terminal connected to the cathode of the diode Z1 and supplied with stable voltage by diode Z1, and a VSS terminal connected to the negative power terminal. A parallel circuit consisting of a variable capacitor C2 and a fixed capacitor C3 is connected between input terminal OSC1 of monolithic processor 22 and the negative power terminal. A resistor R3 is connected between the VDD terminal of monolithic processor 22 and input terminal OSC1. A clear terminal MCLR is connected to the VDD terminal.

In operation, an oscillator within the monolithic processor is set to RC oscillating mode. By selecting values of resistor R3, capacitors C2 and C3, the oscillating frequency of the RC oscillator may be set to be around 32 kHz. The capacitance of the variable capacitor C2 may be varied to continuously adjust the resultant frequency. The capacitance ratio of the variable capacitor and the fixed capacitor is preferred to be about 1:10-15. According to individual horn sounding frequency requirement, the oscillating frequency is set to be about 20400-33400 Hz. Individual monolithic processor technical manual may be referred to select values of R and C so as to fix the oscillating frequency.

Frequency division and pulse width adjustment may be achieved by means of registers within the monolithic processor. The frequency division may be conducted prior to pulse width adjustment. Alternatively, the frequency division and pulse width adjustment may be completed simultaneously. By configuring parameters of the registers, different ratio of frequency division and different ratio of duty cycle width may be selected. For an example, a 64-fold division has been done to the oscillating signal, in which the register is used to extend the high and low voltage level 64 times while the high and low voltage levels are adjusted according to a ratio of 5:3, and then output via the terminal OUT1 of the monolithic processor.

The power amplifying part includes a field-effect-transistor T1. The field-effect-transistor T1 has a gate connected to signal output terminal of the monolithic processor to receive the frequency-divided and pulse-width-adjusted signal. The gate is also connected via a resistor R4 to the negative power terminal. Field-effect-transistor T1 has a source terminal connected to the negative power terminal. A parallel connection circuit, which is formed by a diode D2 and a capacitor C4, is connected between the drain and source terminals of field-effect-transistor T1. The anode of diode D2 is connected to the source terminal of field-effect-transistor T1. Field-effecttransistor T1, diode D2 and capacitor C4 form an absorption and protection circuit. Horn 24 is connected between the drain of field-effect-transistor T1 and the cathode of diode D1.

Those skilled in the art will realize that the power amplifying circuit may be implemented by electronic elements such as transistor, field-effect-transistor, insulated gate bipolar transistor (IGBT).

The signal output by monolithic processor 22 is amplified via field-effect-transistor T1 to drive the horn 24 to produce sound.

Figure 3:
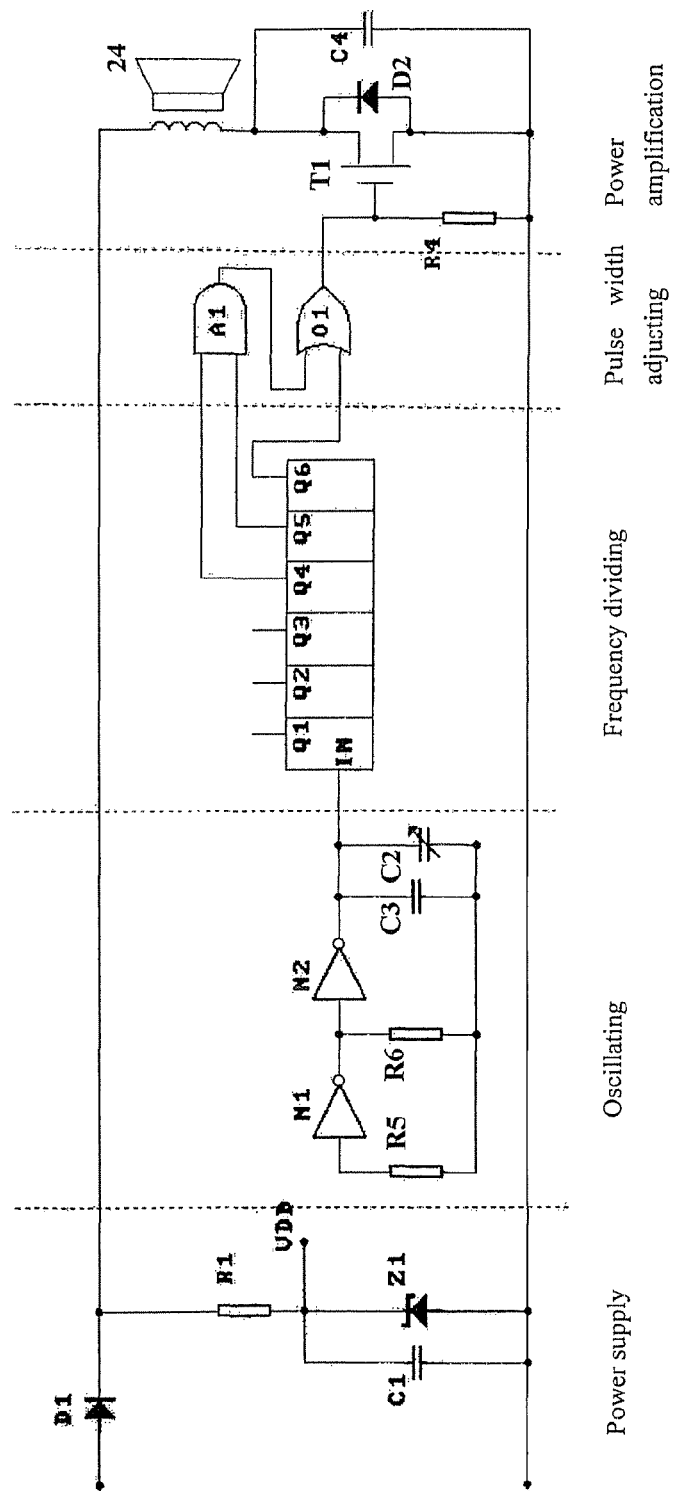
FIG. 3 illustrates the driving circuit according to a second embodiment of present invention.

FIG. 3 illustrates the driving circuit according to a second embodiment of present invention. The driving circuit provides a solution, in which a variable capacitor is used to adjust the circuit's oscillating frequency, a digital circuit to implement frequency division, a pulse combination scheme to implement pulse width adjustment, and transistor(s) to implement power amplifying.

The driving circuit includes a power supply part, an oscillating part, a frequency division part, a pulse width adjusting part and a power amplifying part.

The power supply part includes a regulator, in which a diode D1 protecting from reverse connection and a current limiting resistor R1 and a regulating diode Z1 are connected in series. The diode D1 has its anode connected with the positive power terminal, and its cathode connected with resistor R1. A capacitor C1 is in parallel connection with the diode Z1, and then connected between the negative power terminal and resistor R1, thereby to provide stable voltage VDD.

The oscillation part includes a CMOS inverting amplifier N1 and N2. Between the output terminal and input terminal of the amplifier N1 are connected a circuit including resistor R5 and R6. The amplifier N2 has an output terminal connected via a parallel circuit formed by a variable capacitor C2 and a capacitor C3 to the joint point of R5 and R6. Thereby, amplifiers N1 and N2, resistors R5 and R6, and capacitors C2 and C3 form a multi-vibrator. The multi-vibrator outputs, at the output terminal of the amplifier N2, a signal having an oscillating frequency. The oscillating frequency may be calculated by $f=\frac{1}{2}\cdot 2R3*(C2+C3)$. The capacitance of capacitor C2 may be varied so as to continuously adjust the oscillating frequency. The capacitance ratio between variable capacitor C2 and fixed capacitor C3 is preferred to be about 1:10-15. The frequency division part includes a set of flip-flops Q1, Q2, Q3, Q4, Q5 and Q6 connected in cascade. The oscillating frequency signal generated by the oscillation part is input, at output terminal of inverting amplifier N2, into the input terminal of flip-flop Q1. The output terminal of flip-flop Q1 is connected with input terminal of flip-flop Q2. The output terminal of flip-flop Q2 is connected with input terminal of flip-flop Q3, . . . , and the output terminal of flip-flop Q5 is connected with input terminal of flip-flop Q6. The output terminal of flip-flop Q6 outputs a 64-fold divided signal. It shall be noted that the number of flip-flops may not be limited to 6, and may be varied depending on desired frequency division ratio. In addition, the set of flip-flops may be connected in other ways.

Figure 4:
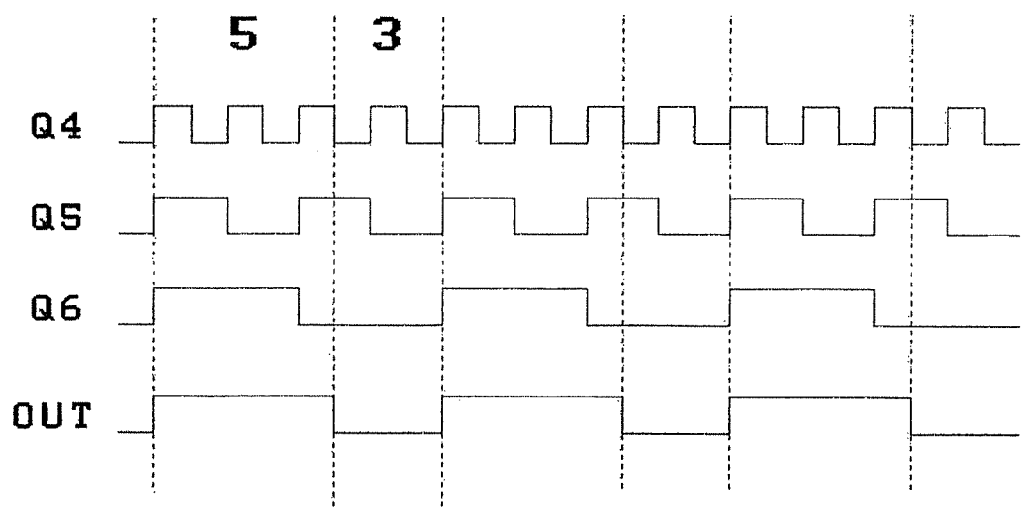
FIG. 4 illustrates wave diagram generated by the wave-width adjusting part as shown in FIG. 3.

The pulse width adjustment part conducts pulse width adjustment in the way of pulse combination by using AND gate and OR gate. The part includes AND gate A1 and OR gate O1. Output signals of flip-flop Q4 and Q5 are respectively input into two input terminals of AND gate A1. The output terminal of gate A1 is connected to an input terminal of OR gate O1, and the output terminal of flip-flop Q6 is connected to the other input terminal of OR gate O1. OR gate O1 generates a pulse width adjusted signal with high to low level ratio of 5:3, which is input into the power amplifying part so as to drive horn 24 to produce sound. FIG. 4 illustrates a wave diagram generated by the wave width adjustment part as shown in FIG. 3.

Those skilled in the art realize that other ways of pulse combination may be adopted to generate signals with varying pulse width ratio.

The power amplifying part includes a field-effect-transistor T1, gate of which is connected to output terminal of OR gate O1 to receive pulse-width-adjusted signal. Other portions of the power amplification part remain the same as those of the power amplification part as shown in FIG. 2, and thus their description will be omitted. The signal amplified by field-effect-transistor T1 drives the horn 24 to produce sound.

It will be obvious to those skilled in the art that various changes and modifications may be made therein.

For example, the oscillating circuit may be formed by a RC oscillating circuit within a monolithic processor, gate circuit (including NAND gate, NOR gate), Schmitt circuit, operation amplifier, or discrete elements.

In addition, the frequency division circuit may be implemented by registers in a monolithic processor, or by cascaded flip-flops or programmable logic device.

Furthermore, pulse width adjustment circuit may be implemented by registers in a monolithic processor, or by digital circuit (for example, monostable circuit, Schmitt circuit, programmable logic device). To adjust pulse width, other ways may also be adopted, such as pulse combination by means of gate circuit including NAND gate and NOR gate or diode, or operation amplifier.

It is aimed, therefore, to cover in the appended claims all such changes and modifications as fall within the true spirit and scope of the invention, which is defined by the metes and bounds of the appended claims.

What is claimed is:

1. A driving circuit for an electronic vehicle horn, including
an oscillating circuit, said oscillating circuit generating a signal having an oscillating frequency, and
a frequency division circuit,
wherein said frequency division circuit conducts frequency division with respect to the signal having the oscillating frequency to generate a frequency-divided signal,
wherein said driving circuit generates a driving signal from the frequency-divided signal to drive the electronic vehicle horn to produce a sound,
wherein said oscillating circuit includes a continuously variable capacitor, and the oscillating frequency is changed by adjusting capacitance of the continuously variable capacitor so as for the frequency of the driving signal to be consistent with working frequency of the electronic vehicle horn.

2. A driving circuit for an electronic horn as claimed in claim 1, wherein said oscillating circuit is implemented by a RC oscillator within a monolithic processor.

3. A driving circuit for an electronic horn as claimed in claim 1, wherein said oscillating circuit includes a second capacitor connected in parallel with the variable capacitor.

4. A driving circuit for an electronic horn as claimed in claim 3, wherein the capacitance ratio of the variable capacitor and the second capacitor is approximately 1:10-15.

5. A driving circuit for an electronic horn as claimed in claim 1, wherein the oscillating frequency is approximately between 20400-33400 Hz.

6. A driving circuit for an electronic horn as claimed in claim 1, wherein said oscillating circuit is a multi-vibrator formed of inverters.

7. A driving circuit for an electronic horn as claimed in claim 1, wherein said oscillating circuit is formed by gate circuits, schmitt circuit, operation amplifier or discrete elements.

8. A driving circuit for an electronic horn as claimed in claim 1, wherein said driving circuit comprises a regulating circuit.

9. A driving circuit for an electronic horn as claimed in claim 1, wherein the frequency division circuit is implemented by register of a monolithic processor, multi-stage flip-flops, or programmable logic devices.

10. A driving circuit for an electronic horn as claimed in claim 1, wherein said driving circuit comprises a pulse width adjusting circuit, which conducts pulse width adjustment to the frequency divided signal.

11. A driving circuit for an electronic horn as claimed in claim 10, wherein said pulse width adjusting circuit is implemented by register of a monolithic processor, a gate circuit, or other digital circuit.

12. A driving circuit for an electronic horn as claimed in claim 11, wherein said digital circuit comprises a monostable circuit, a Schmitt circuit or a programmable logic device.

13. A driving circuit for an electronic horn as claimed in claim 10, wherein the pulse-width-adjusted signal has a high to low level ratio of 5:3.

14. A driving circuit for an electronic horn as claimed in claim 1, wherein said frequency division circuit comprises a frequency dividing and pulse width adjusting circuit, which conducts frequency division and pulse width adjustment simultaneously to the signal having the oscillating frequency to generate frequency-divided and pulse-width-adjusted signal, said driving signal is generated based on the frequency-divided and pulse-width-adjusted signal.

15. A driving circuit for an electronic horn as claimed in claim 1, wherein said digital circuit comprises a power amplification circuit, which generates the driving signal.

16. A driving circuit for an electronic horn as claimed in claim 15, wherein said power amplification circuit includes transistor, field-effect-transistor, or insulated gate bipolar transistor.

17. A driving circuit for an electronic horn as claimed in claim 1, wherein adjusting capacitance of said continuously variable capacitor directly controls the frequency of the driving signal.

18. A method of driving an electronic vehicle horn, said method comprising:
    generating, by an oscillating circuit having a continuously variable capacitor, a signal having an oscillating frequency;
    conducting frequency division to the signal having the oscillating frequency;
    generating a driving signal from the frequency-divided signal to drive the electronic vehicle horn to produce a sound,
    wherein said method comprises changing the oscillating frequency by adjusting capacitance of the continuously variable capacitor so as for the frequency of the driving signal to be consistent with working frequency of the electronic vehicle horn.

19. A method as claimed in claim 18, wherein said step of generating driving signal comprises conducting pulse width adjustment to the frequency divided signal.

20. A method as claimed in claim 18, wherein said step of generating the driving signal comprises conducting simultaneously both frequency division and pulse width adjustment to the signal having the oscillating frequency.

21. A method as claimed in claim 18, wherein said step of generating driving signal comprises step of power amplification.

\* \* \* \* \*